United States Patent
Chang et al.

(10) Patent No.: US 11,792,497 B2
(45) Date of Patent: Oct. 17, 2023

(54) SENSOR LENS ASSEMBLY HAVING NON-REFLOW CONFIGURATION

(71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Jui-Hung Hsu, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 0 days.

(21) Appl. No.: 17/667,625

(22) Filed: Feb. 9, 2022

(65) Prior Publication Data
US 2022/0360692 A1  Nov. 10, 2022

Related U.S. Application Data

(60) Provisional application No. 63/184,622, filed on May 5, 2021.

(30) Foreign Application Priority Data

Oct. 20, 2021  (TW) .................................. 110138813

(51) Int. Cl.
*H04N 5/335* (2011.01)
*H04N 23/54* (2023.01)
*H04N 23/51* (2023.01)
*H04N 23/55* (2023.01)

(52) U.S. Cl.
CPC ............. *H04N 23/54* (2023.01); *H04N 23/51* (2023.01); *H04N 23/55* (2023.01)

(58) Field of Classification Search
CPC ...................................................... H05K 1/183
See application file for complete search history.

(56) References Cited

U.S. PATENT DOCUMENTS

| | | | |
|---|---|---|---|
| 7,638,864 B2* | 12/2009 | Wu | H01L 27/14618 257/773 |
| 10,748,829 B2* | 8/2020 | Chen | H01L 27/14627 |
| 2003/0128442 A1* | 7/2003 | Tanaka | H04N 23/54 257/E31.127 |
| 2008/0191333 A1* | 8/2008 | Yang | H01L 27/14618 257/E23.18 |

(Continued)

*Primary Examiner* — Gary C Vieaux
(74) *Attorney, Agent, or Firm* — Li & Cai Intellectual Property (USA) Office

(57) ABSTRACT

A sensor lens assembly having a non-reflow configuration is provided. The sensor lens assembly includes a circuit board, an optical module fixed to a surface of the circuit board, a sensor chip assembled to the circuit board, a plurality of wires electrically coupling the sensor chip and the circuit board, a supporting adhesive layer, and a light-permeable sheet. The circuit board has a chip-receiving slot recessed in the surface thereof. The sensor chip is arranged in the chip-receiving slot, and a top surface of the sensor chip and the surface of the circuit board have a step difference therebetween that is less than or equal to 10 μm. The supporting adhesive layer is in a ringed shape and is disposed on the top surface of the sensor chip. The light-permeable sheet is disposed on the supporting adhesive layer and faces the sensor chip.

9 Claims, 10 Drawing Sheets

(56) References Cited

U.S. PATENT DOCUMENTS

| | | | |
|---|---|---|---|
| 2009/0128681 A1* | 5/2009 | Kim | H04N 23/57 |
| | | | 348/335 |
| 2012/0268644 A9* | 10/2012 | Lin | G02B 7/02 |
| | | | 348/340 |
| 2014/0346627 A1* | 11/2014 | Yamada | H04N 23/57 |
| | | | 257/431 |
| 2017/0163859 A1* | 6/2017 | Dobashi | G02B 7/006 |
| 2018/0205866 A1* | 7/2018 | Komai | H01L 27/1463 |
| 2020/0083270 A1* | 3/2020 | Yamamoto | H04N 23/53 |
| 2022/0115426 A1* | 4/2022 | Son | H01L 27/14683 |

\* cited by examiner

SENSOR LENS ASSEMBLY HAVING NON-REFLOW CONFIGURATION

CROSS-REFERENCE TO RELATED PATENT APPLICATION

This application claims the benefit of priority to Taiwan Patent Application No. 110138813, filed on Oct. 20, 2021. The entire content of the above identified application is incorporated herein by reference.

This application claims priority to the U.S. Provisional Patent Application Ser. No. 63/184,622 filed on May 5, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor lens assembly, and more particularly to a sensor lens assembly having a non-reflow configuration.

BACKGROUND OF THE DISCLOSURE

A conventional sensor lens assembly is manufactured by fixing a sensor package structure onto a circuit board during a reflow process and then assembling an optical module to the circuit board. However, a structural configuration of the conventional sensor lens assembly is limited by the sensor package structure, so that the structural configuration of the conventional sensor lens assembly is difficult to be improved. For example, since the sensor package structure of the conventional sensor lens assembly needs to undergo the reflow process for being fixed onto the circuit board, the connection between any two components of the sensor package structure must be capable of resisting high temperature.

SUMMARY OF THE DISCLOSURE

In response to the above-referenced technical inadequacy, the present disclosure provides a sensor lens assembly having a non-reflow configuration to effectively improve on the issues associated with conventional sensor lens assemblies.

In one aspect, the present disclosure provides a sensor lens assembly having a non-reflow configuration, which includes a circuit board, an optical module, a sensor chip, a plurality of wires, a supporting adhesive layer, and a light-permeable sheet. The circuit board has a first surface and a second surface that is opposite to the first surface. The circuit board has a chip-receiving slot recessed in the first surface, and the circuit board includes a plurality of soldering pads that are arranged on the first surface and adjacent to the chip-receiving slot. The optical module includes a frame, at least one lens, and a filtering sheet. The frame is fixed on the first surface of the circuit board. The at least one lens is assembled into the frame, and a central axis of the at least one lens passes through the chip-receiving slot. The filtering sheet is assembled into the frame and is positioned along the central axis. The frame, the filtering sheet, and the first surface jointly define a distribution space, and the chip-receiving slot and the soldering pads are arranged in the distribution space. The sensor chip includes a sensing region arranged on a top surface thereof and a plurality of connection pads that are arranged on the top surface and outside of the sensing region. The sensor chip is disposed in the chip-receiving slot, and the top surface of the sensor chip and the first surface of the circuit board have a step difference therebetween that is less than or equal to 10 μm. The soldering pads are respectively and electrically coupled to the connection pads through the wires. The supporting adhesive layer is in a ringed shape and is arranged outside of the sensing region. The light-permeable sheet is disposed on the supporting adhesive layer and faces the sensor chip, so that the light-permeable sheet, the supporting adhesive layer, and the top surface of the sensor chip jointly define an enclosed space.

Therefore, through cooperation of the above components, the sensor lens assembly provided by the present disclosure does not need to go through any reflow process through the non-reflow configuration thereof, such as to allow that the component relationships arranged in the distribution space (e.g., connection between any two of the sensor chip, the wires, the supporting adhesive layer, and the light-permeable sheet) just need to satisfy a lower level of high-temperature resistance requirement. Accordingly, a material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
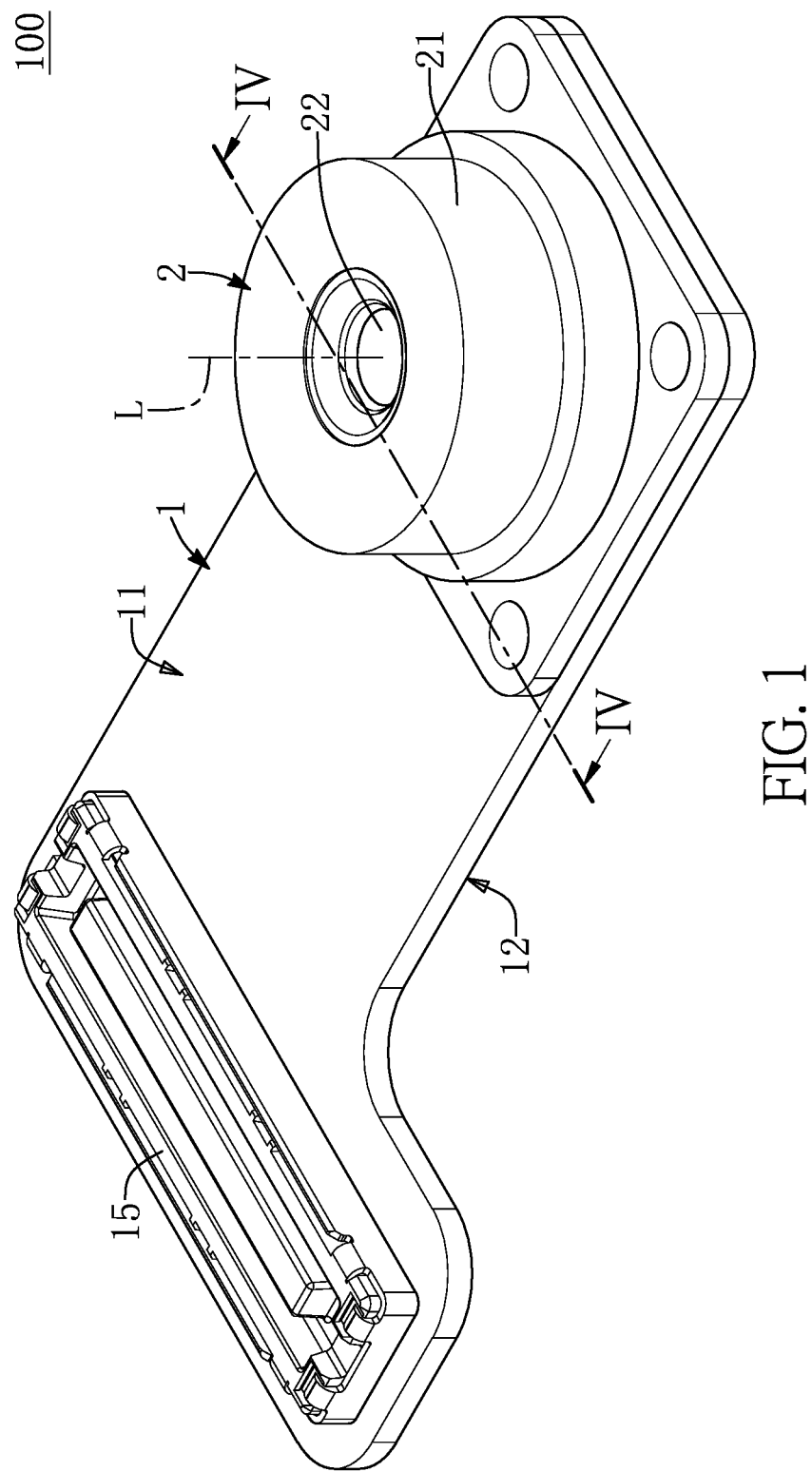
FIG. 1 is a perspective view of a sensor lens assembly having a non-reflow configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
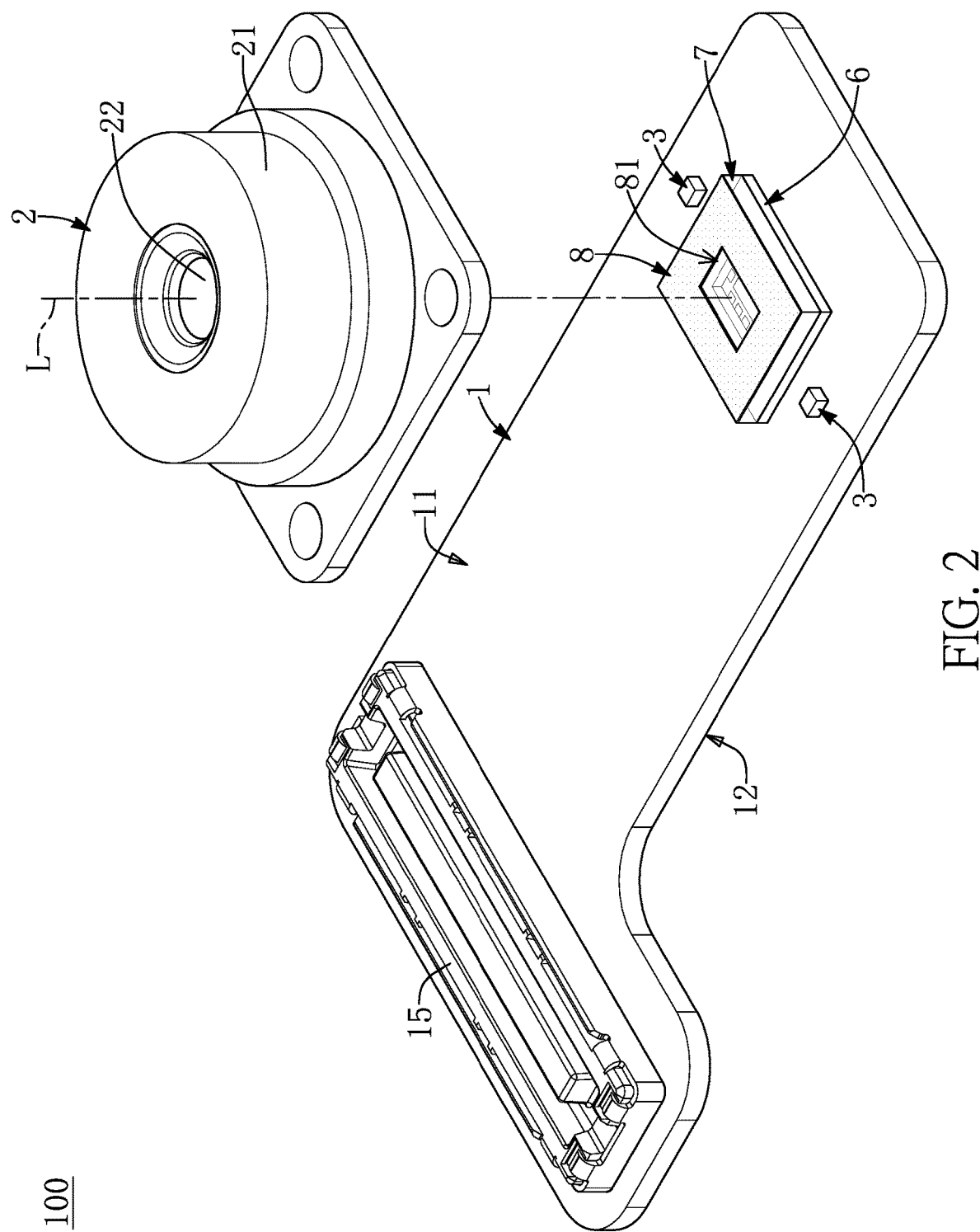
FIG. 2 is an exploded view of FIG. 1.

Referring to FIG. 1 to FIG. 8, a first embodiment of the present disclosure provides a sensor lens assembly 100 having a non-reflow configuration. As shown in FIG. 1 and FIG. 2, the sensor lens assembly 100 of the present embodiment does not have any package structure therein. In other words, any sensor lens assembly, which has a package structure or is formed by implementing a reflow process, is different from the sensor lens assembly 100 of the present embodiment.

Figure 3:
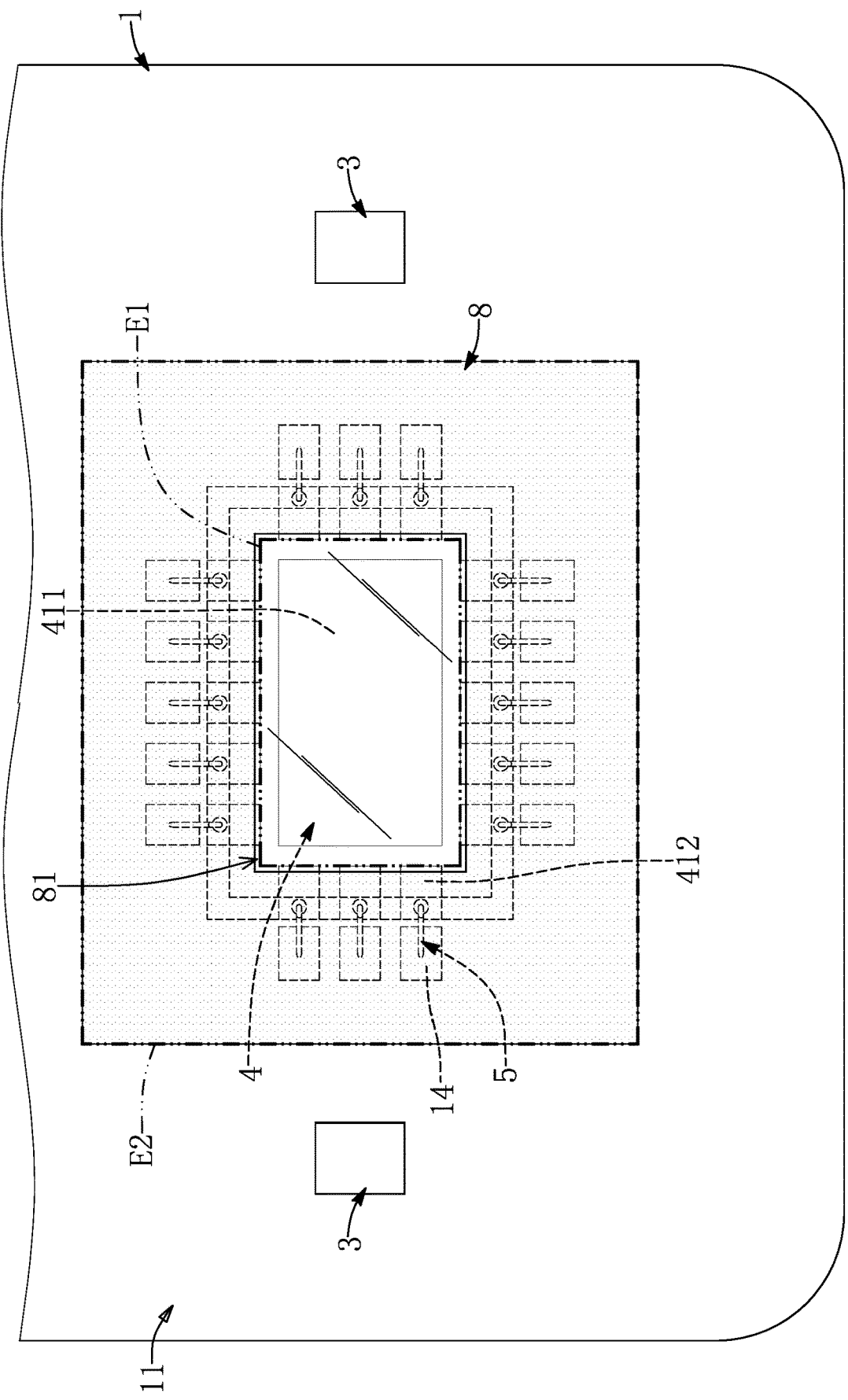
FIG. 3 is a partial top view of FIG. 2 when an optical module is omitted.
Figure 4:
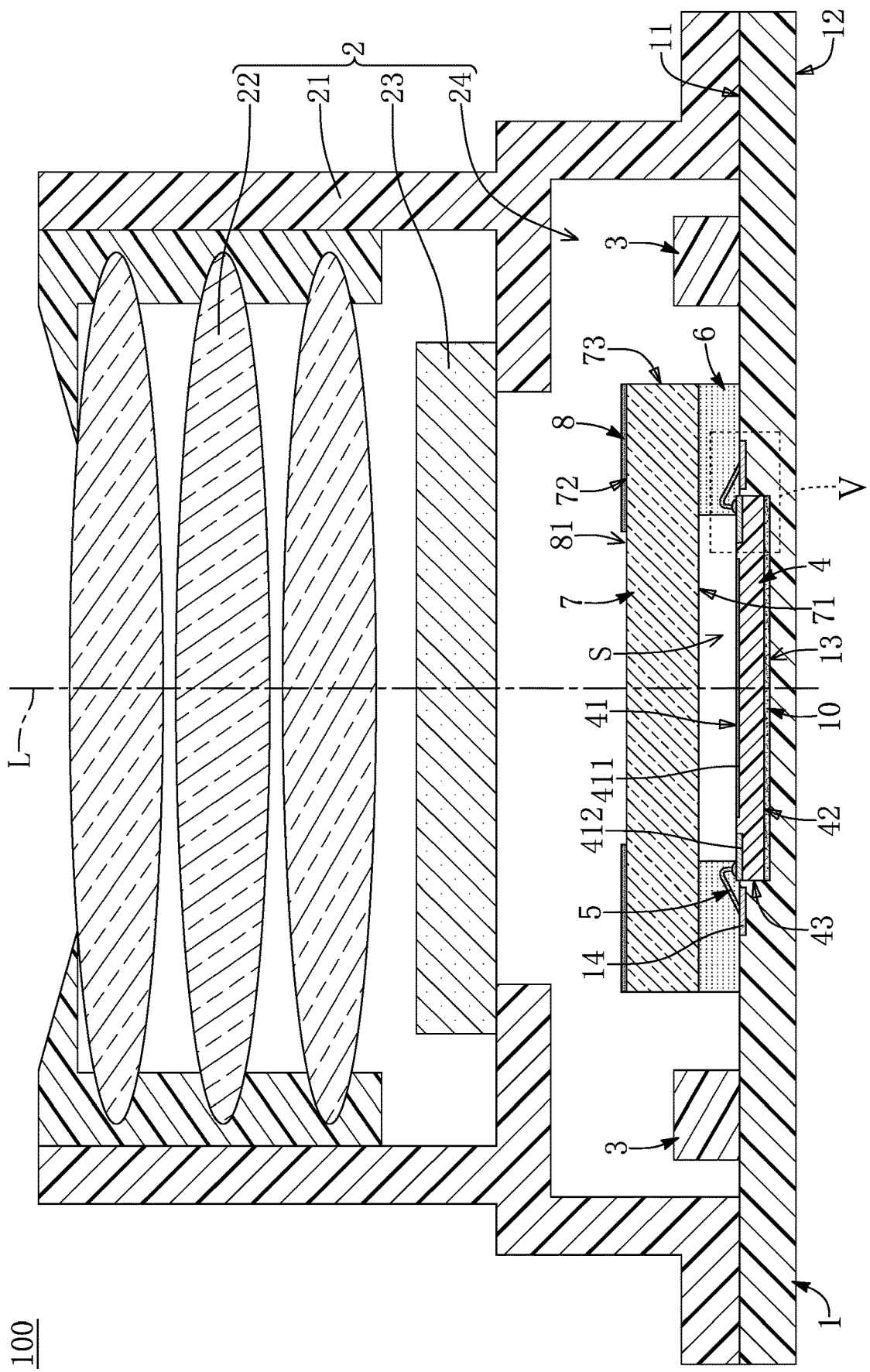
FIG. 4 is a cross-sectional view taken along line IV-IV of FIG. 1.
Figure 5:
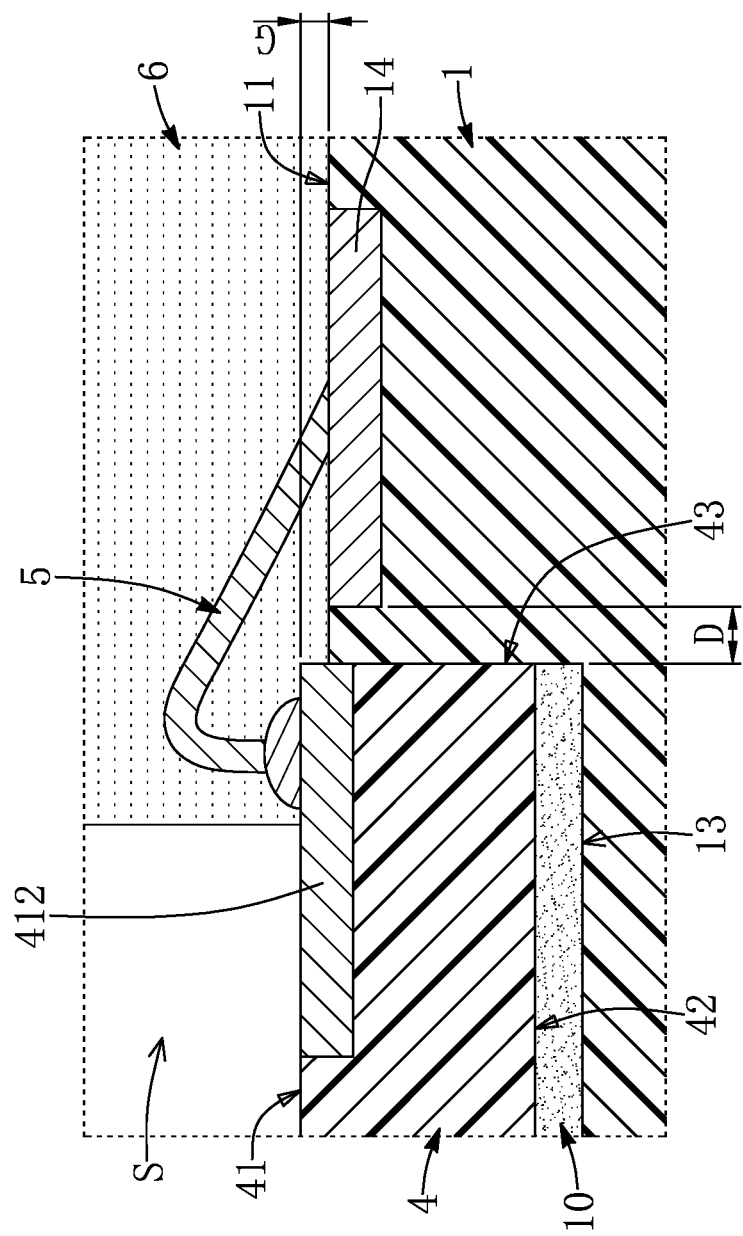
FIG. 5 is an enlarged view of portion V of FIG. 4.
Figure 6:
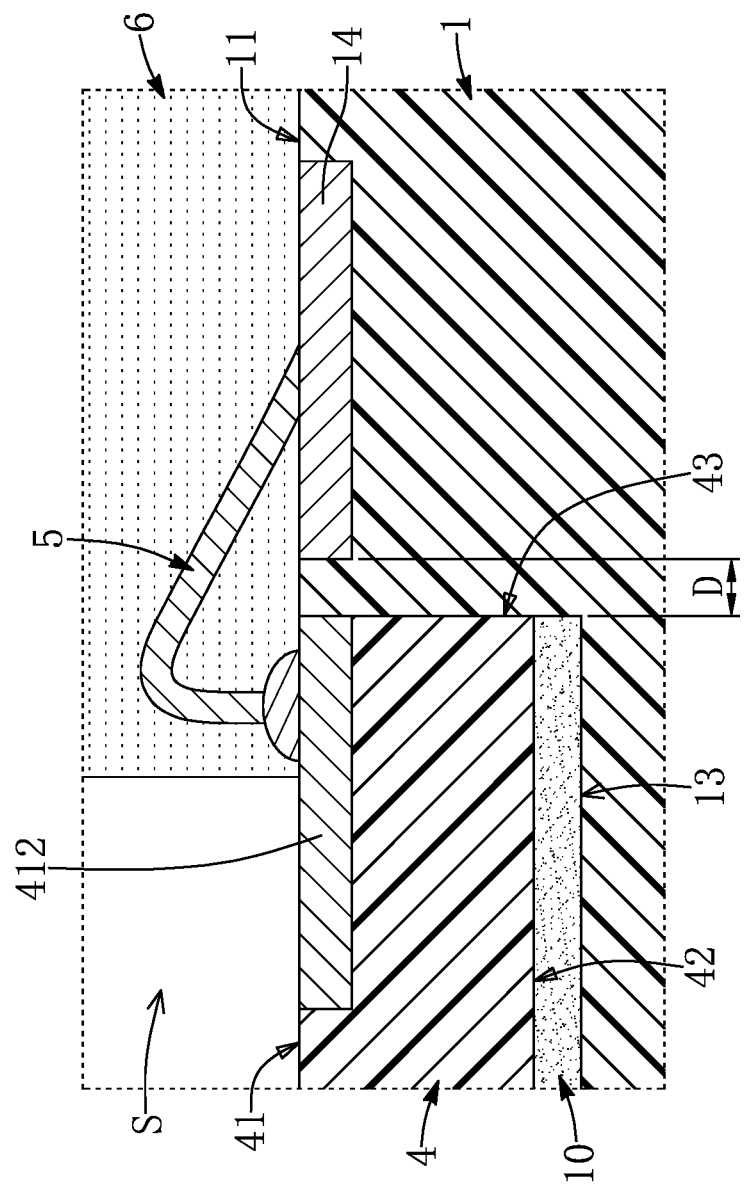
FIG. 6 is an enlarged view showing the portion V of FIG. 4 in another configuration.

As shown in FIG. 3 to FIG. 5 the sensor lens assembly 100 includes a circuit board 1, an optical module 2 fixed to the circuit board 1, at least one passive electronic component 3 assembled to the circuit board 1, a sensor chip 4 assembled to the circuit board 1, a plurality of wires 5 electrically coupling the sensor chip 4 and the circuit board 1, a supporting adhesive layer 6 disposed on the sensor chip 4, a light-permeable sheet 7 disposed on the supporting adhesive layer 6, and a shielding layer 8 that is formed on the light-permeable sheet 7.

The sensor lens assembly 100 in the present embodiment is described by including the above components, but the sensor lens assembly 100 can be adjusted or changed according to design requirements. For example, in other embodiments of the present disclosure not shown in the drawings, the sensor lens assembly 100 can be provided by omitting the at least one passive electronic component 3.

The circuit board 1 in the present embodiment can be a printed circuit board (PCB) or a flexible printed circuit (FPC), but the present disclosure is not limited thereto. The circuit board 1 has a first surface 11 and a second surface 12 that is opposite to the first surface 11. The circuit board 1 has a chip-receiving slot 13 recessed in the first surface 11, and the circuit board 1 includes a plurality of soldering pads 14 that are arranged on the first surface 11 and adjacent to the chip-receiving slot 13. In the present embodiment, the soldering pads 14 are arranged outside of the chip-receiving slot 13 and are in a ring-shaped arrangement, and each of the soldering pads 14 is spaced apart from the chip-receiving slot 13 by a spacing distance D that is preferably less than or equal to 100 μm, but the present disclosure is not limited thereto.

In addition, as shown in FIG. 1 and FIG. 2, the circuit board 1 can be provided with an electrical connector 15. The circuit board 1 is configured to be detachably connected to an electronic device (not shown in the drawings) through the electrical connector 15, so that the sensor lens assembly 100 can be assembled and electrically connected to the electronic device.

As shown in FIG. 3 to FIG. 5, the optical module 2 includes a frame 21, at least one lens 22 assembled into the frame 21, and a filtering sheet 23 assembled into the frame 21. A bottom of the frame 21 is fixed to the first surface 11 of the circuit board 1, a central axis L of the at least one lens 22 passes through the chip-receiving slot 13, and the filtering sheet 23 is positioned along the central axis L. The at least one passive electronic component 3 is assembled to the first surface 11 of the circuit board 1 and is arranged adjacent to the frame 21. Moreover, a quantity of the at least one passive electronic component 3 can be adjusted or changed according to design requirements, and outer lateral edges of the circuit board 1 can be partially flush with the frame 21 (e.g., three of the outer lateral edges of the circuit board 1 are flush with the frame 21), but the present disclosure is not limited thereto.

Specifically, a quantity of the at least one lens 22 in the present embodiment is more than one, and the central axes L of the multiple ones of the lens 22 are overlapped with each other, and the filtering sheet 23 is located between the lenses 22 and the chip-receiving slot 13. The frame 21, the filtering sheet 23, and the first surface 11 of the circuit board 1 jointly define a distribution space 24. Moreover, the chip-receiving slot 13, the soldering pads 14, the at least one passive electronic component 3, the sensor chip 4, the wires 5, the supporting adhesive layer 6, the light-permeable sheet 7, and the shielding layer 8 are arranged in the distribution space 24.

The sensor chip 4 in the present embodiment is an image sensor chip, but the present disclosure is not limited thereto. The sensor chip 4 is disposed in the chip-receiving slot 13 of the circuit board 1 (e.g., a bottom surface 42 of the sensor chip 4 faces a bottom of the chip-receiving slot 13), and is located at the central axis L. Moreover, the top surface 41 of the sensor chip 4 and the first surface 11 of the circuit board 1 have a step difference G therebetween that is less than or equal to 10 μm. In other words, the step difference G can be less than or equal to 5 μm, and the step difference G is preferably zero (i.e., the top surface 41 of the sensor chip 4 is coplanar with the first surface 11 of the circuit board 1).

It should be noted that the sensor lens assembly 100 in the present embodiment includes a thermally conductive adhesive 10 disposed in the chip-receiving slot 13, and the sensor chip 4 is fixed in the chip-receiving slot 13 through the thermally conductive adhesive 10 (e.g., the bottom surface 42 of the sensor chip 4 is adhered to the bottom of the chip-receiving slot 13 through the thermally conductive adhesive 10), but the present disclosure is not limited thereto. For example, in other embodiments of the present disclosure not shown in the drawings, the thermally conductive adhesive 10 can be omitted or can be replaced by other components.

Moreover, the sensor chip 4 includes a sensing region 411 arranged on the top surface 41 and a plurality of connection pads 412 that are arranged on the top surface 41 and outside of the sensing region 411. The filtering sheet 23 is chosen according to (or corresponding to) the sensing region 411 of the sensor chip 4. For example, when light passes through the at least one lens 22, the filtering sheet 23 is configured to (only) allow the light of a wavelength band corresponding to the sensing region 411 to pass therethrough.

In the present embodiment, the connection pads 412 preferably correspond in position to the soldering pads 14, respectively. An outer edge of each of the connection pads 412 is located at a surrounding lateral surface 43 of the sensor chip 4, and is spaced apart from the corresponding soldering pad 14 by a distance that is less than or equal to 100 μm and that is substantially equal to the spacing distance D, but the present disclosure is not limited thereto.

For example, in other embodiments of the present disclosure not shown in the drawings, the outer edge of each of the connection pads 412 can be located inside of the surrounding lateral surface 43 of the sensor chip 4, so that the distance between the outer edge of each of the connection pads 412 and the corresponding soldering pad 14 can be greater than the spacing distance D.

Specifically, the connection pads 412 arranged on the top surface 41 in the present embodiment surround the sensing region 411 in a substantially ring-shaped arrangement, but the present disclosure is not limited thereto. For example, in other embodiments of the present disclosure not shown in the drawings, the connection pads 412 can be arranged in two rows that are respectively located at two opposite sides of the sensing region 411, the soldering pads 14 can also be arranged in two rows that are respectively located at two opposite sides of the chip-receiving slot 13, and the connection pads 412 respectively correspond in position to the soldering pads 14.

The wires 5 electrically couple the soldering pads 14 to the connection pads 412, respectively. In other words, each of the wires 5 is formed in a wiring manner, so that two opposite ends of each of the wires 5 are respectively connected to one of the soldering pads 14 and the corresponding connection pad 412.

Accordingly, the sensor lens assembly 100 in the present embodiment is provided with the sensor chip 4 that is disposed in the chip-receiving slot 13 by a specific condition (e.g., the step difference G is less than or equal to 10 μm), so that formation of each of the wires 5 is no longer limited by height of the sensor chip 4, and the distance between any one of the soldering pads 14 and the corresponding connection pad 412 can be reduced.

The supporting adhesive layer 6 is in a ringed shape, and is disposed on the first surface 11 of the circuit board 1 and the top surface 41 of the sensor chip 4. The light-permeable sheet 7 is disposed on the supporting adhesive layer 6 and faces the sensing region 411 of the sensor chip 4 (i.e., the supporting adhesive layer 6 is sandwiched between the first surface 11 of the circuit board 1 and an inner surface 71 of the light-permeable sheet 7), so that the light-permeable sheet 7, the supporting adhesive layer 6, and the top surface 41 of the sensor chip 4 jointly define an enclosed space S. The sensing region 411 is arranged in the enclosed space S and faces the light-permeable sheet 7.

Accordingly, the sensor lens assembly 100 in the present embodiment is provided with the sensor chip 4 that is disposed in the chip-receiving slot 13 by the specific condition (e.g., the step difference G is less than or equal to 10 μm), so that the supporting adhesive layer 6 can be applied to (or distributed on) a larger region, thereby satisfying different distributions according to design requirements.

Specifically, inner edges of the connection pads 412 arranged in the ring-shaped arrangement jointly define an inner boundary E1, and a projection region defined by orthogonally projecting the surrounding lateral surface 73 of the light-permeable sheet 7 onto the first surface 11 is defined as an outer boundary E2. The supporting adhesive layer 6 can be disposed on at least part of a region between the inner boundary E1 and the outer boundary E2.

Figure 7:
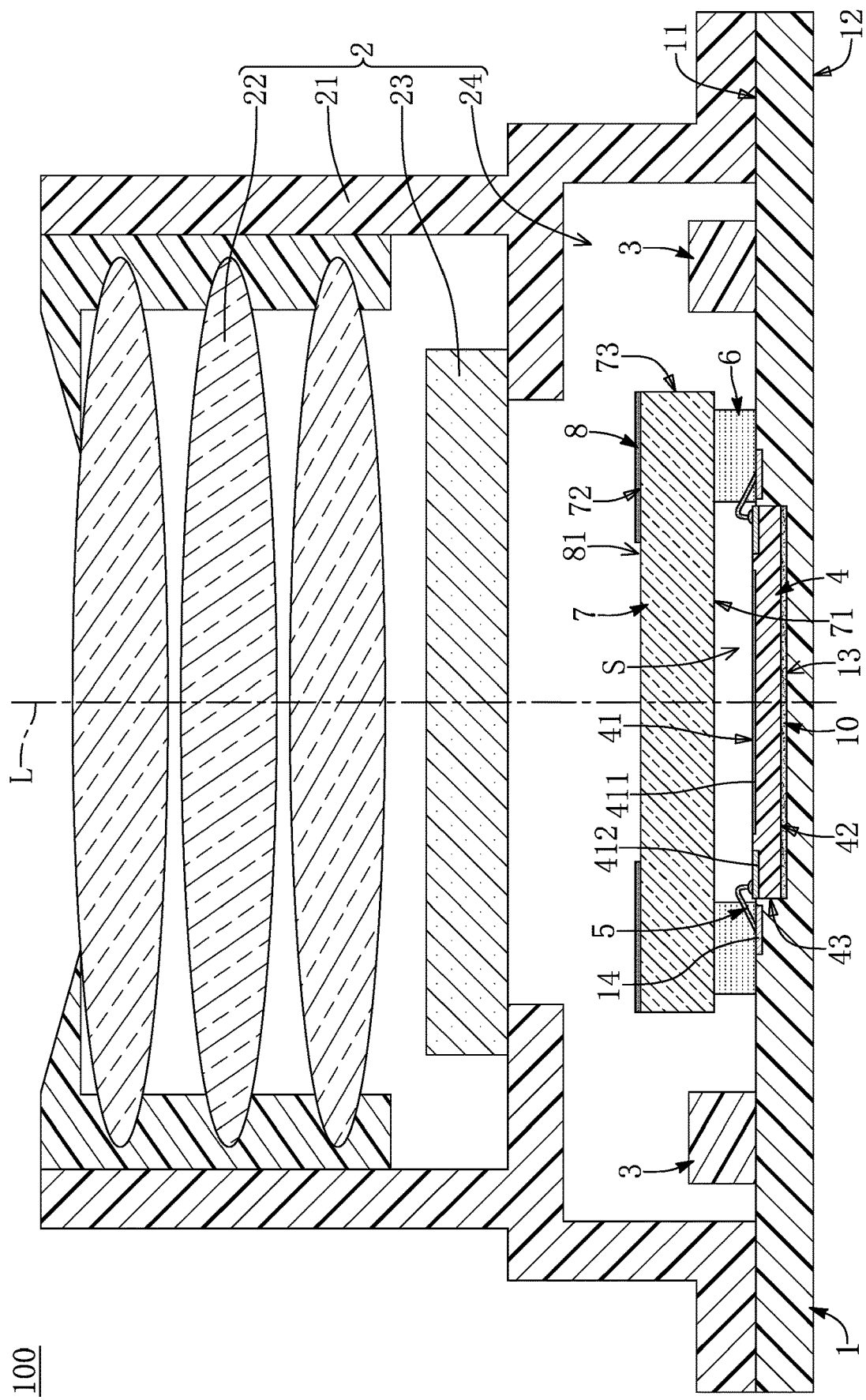
FIG. 7 is a cross-sectional view showing the sensor lens assembly in another configuration according to the first embodiment of the present disclosure.
Figure 8:
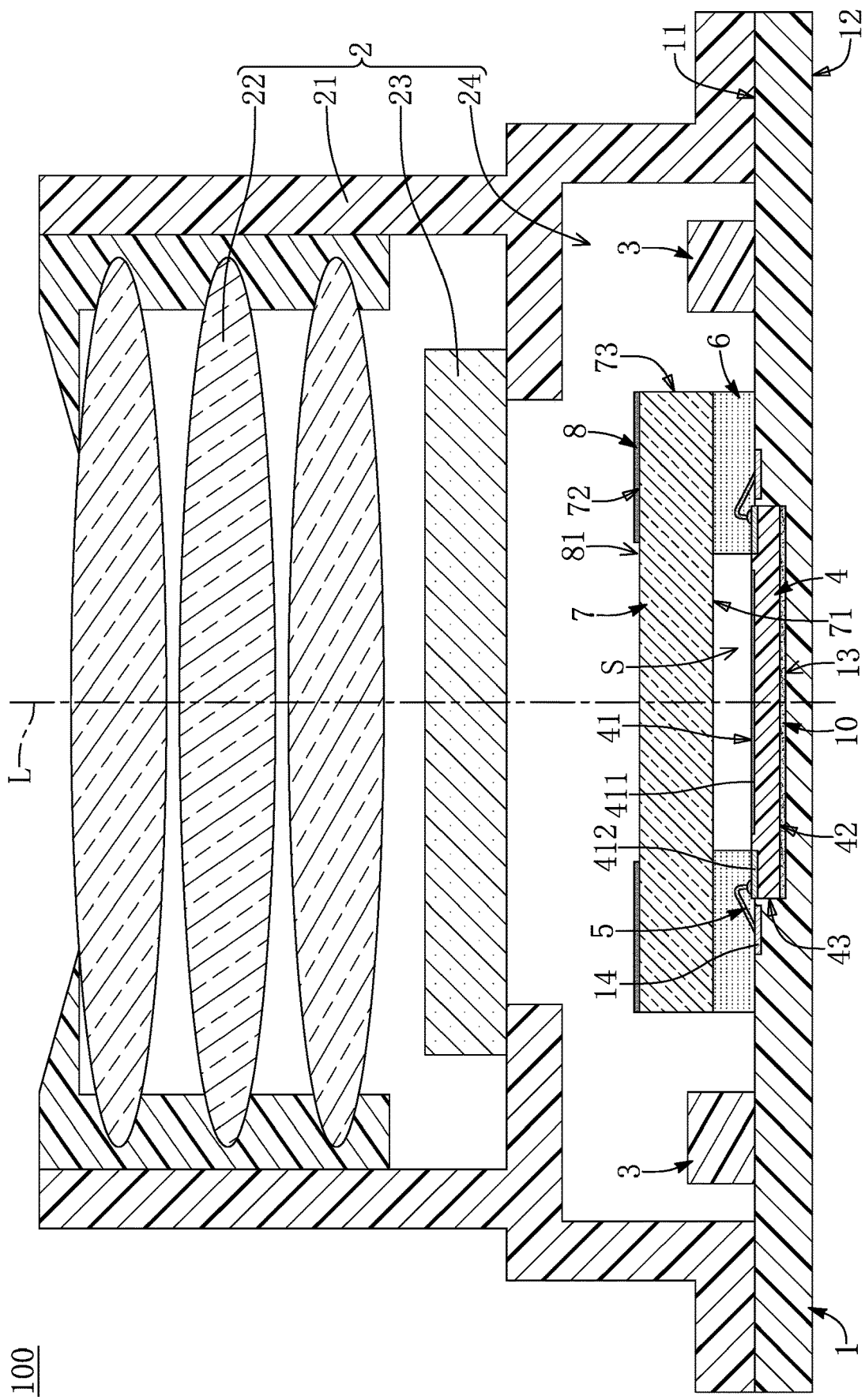
FIG. 8 is a cross-sectional view showing the sensor lens assembly in yet another configuration according to the first embodiment of the present disclosure.

In other words, if the supporting adhesive layer 6 is arranged on the region between the inner boundary E1 and the outer boundary E2, specific position and volume of the supporting adhesive layer 6 can be adjusted or changed according to design requirements. For example, as shown in FIG. 7, the supporting adhesive layer 6 can be only disposed on the circuit board 1, and each of the wires 5 is at least partially embedded in the supporting adhesive layer 6; as shown in FIG. 4, the supporting adhesive layer 6 can be disposed on the first surface 11 of the circuit board 1 and an external portion of the top surface 41 of the sensor chip 4 and is arranged outside of the sensing region 411, and at least part of each of the soldering pads 14 and at least part of each of the wires 5 are embedded in the supporting adhesive layer 6; as shown in FIG. 8, edges of the supporting adhesive layer 6 can be flush with the inner edges of the connection pads 412 (e.g., the inner boundary E1 shown in FIG. 3) and the surrounding lateral surface 73 of the light-permeable sheet 7 (e.g., the outer boundary E2 shown in FIG. 3), so that the wires 5, the soldering pads 14, and the connection pads 412 are embedded in the supporting adhesive layer 6.

In addition, as shown in FIG. 3 to FIG. 5, the supporting adhesive layer 6 in the present embodiment is light-permeable, the shielding layer 8 is formed on an outer surface 72 of the light-permeable sheet 7, and the shielding layer 8 is in a ringed shape and has an opening 81 arranged above the sensing region 411. In other words, a projection space defined by orthogonally projecting the shielding layer 8 toward the circuit board 1 is located outside of the sensing region 411, and the supporting adhesive layer 6 and the wires 5 are arranged in the projection space. Accordingly, in the sensor lens assembly 100 of the present embodiment, a flare phenomenon of the sensor chip 4, which is caused by the wires 5 embedded in the supporting adhesive layer 6, can be effectively avoided by forming the shielding layer 8 onto the light-permeable layer 7.

In summary, through cooperation of the above components, the sensor lens assembly 100 provided by the present embodiment does not need to go through any reflow process through the non-reflow configuration thereof, such as to allow that the component relationships arranged in the distribution space 24 (e.g., connection between any two of the sensor chip 4, the wires 5, the supporting adhesive layer 6, and the light-permeable sheet 7) just need to satisfy a lower level of high-temperature resistance requirement. Accordingly, a material cost of the sensor lens assembly 100 can be decreased, and the product yield of the sensor lens assembly 100 can be increased. Specifically, since the sensor lens assembly 100 of the present embodiment does not need to go through a reflow process, the sensor lens assembly 100 does not need to be subjected to relevant testing processes, thereby effectively simplifying the entire production process to improve the production efficiency of the sensor lens assembly 100.

It should be noted that since connection between the frame 21 and the circuit board 1 can have a sealing effect, the sensor lens assembly 100 in the present embodiment does not need to have any package structure. Accordingly, the supporting adhesive layer 6 and the light-permeable sheet 7 in the present embodiment do not need to be surrounded (or encapsulated) by any packaging body.

Second Embodiment

Figure 9:
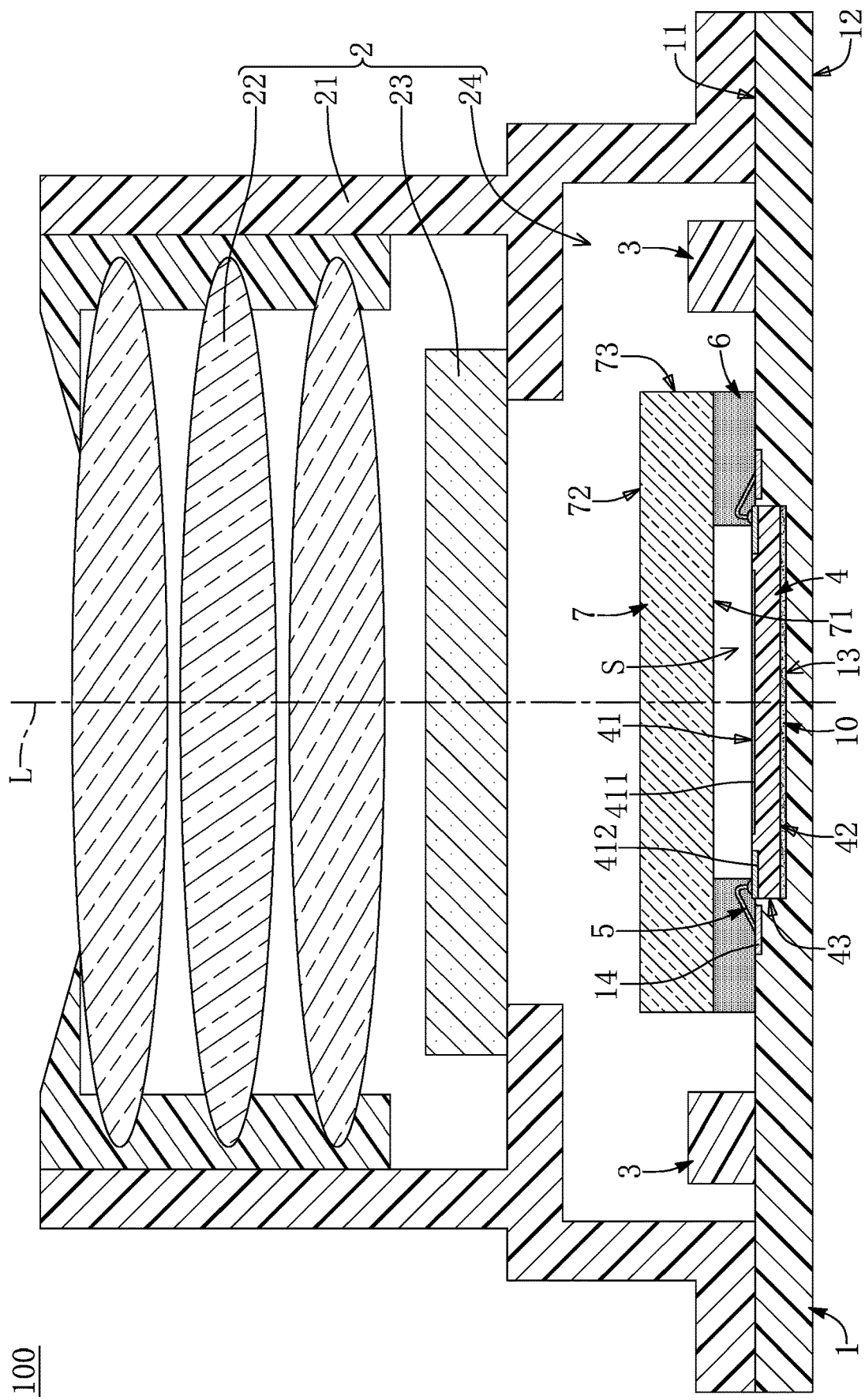
FIG. 9 is a cross-sectional view of the sensor lens assembly according to a second embodiment of the present disclosure.

Referring to FIG. 9, a second embodiment of the present disclosure is provided, which is similar to the first embodiment of the present disclosure. For the sake of brevity, descriptions of the same components in the first and second embodiments of the present disclosure (e.g., the circuit board 1, the optical module 2, and the passive electronic component 3) will be omitted herein, and the following description discloses the different features between the first and second embodiments.

In the present embodiment, the sensor lens assembly 100 does not have the shielding layer 8 described in the first embodiment, the supporting adhesive layer 6 is opaque, and the wires 5, the soldering pads 14, and a part of each of the connection pads 412 are embedded in the supporting adhesive layer 6. Preferably, as shown in FIG. 9, the wires 5, the soldering pads 14, and the connection pads 412 are embedded in the supporting adhesive layer 6, thereby preventing the sensing region 411 of the sensor chip 4 from occurring the flare phenomenon due to the above components.

Third Embodiment

Figure 10:
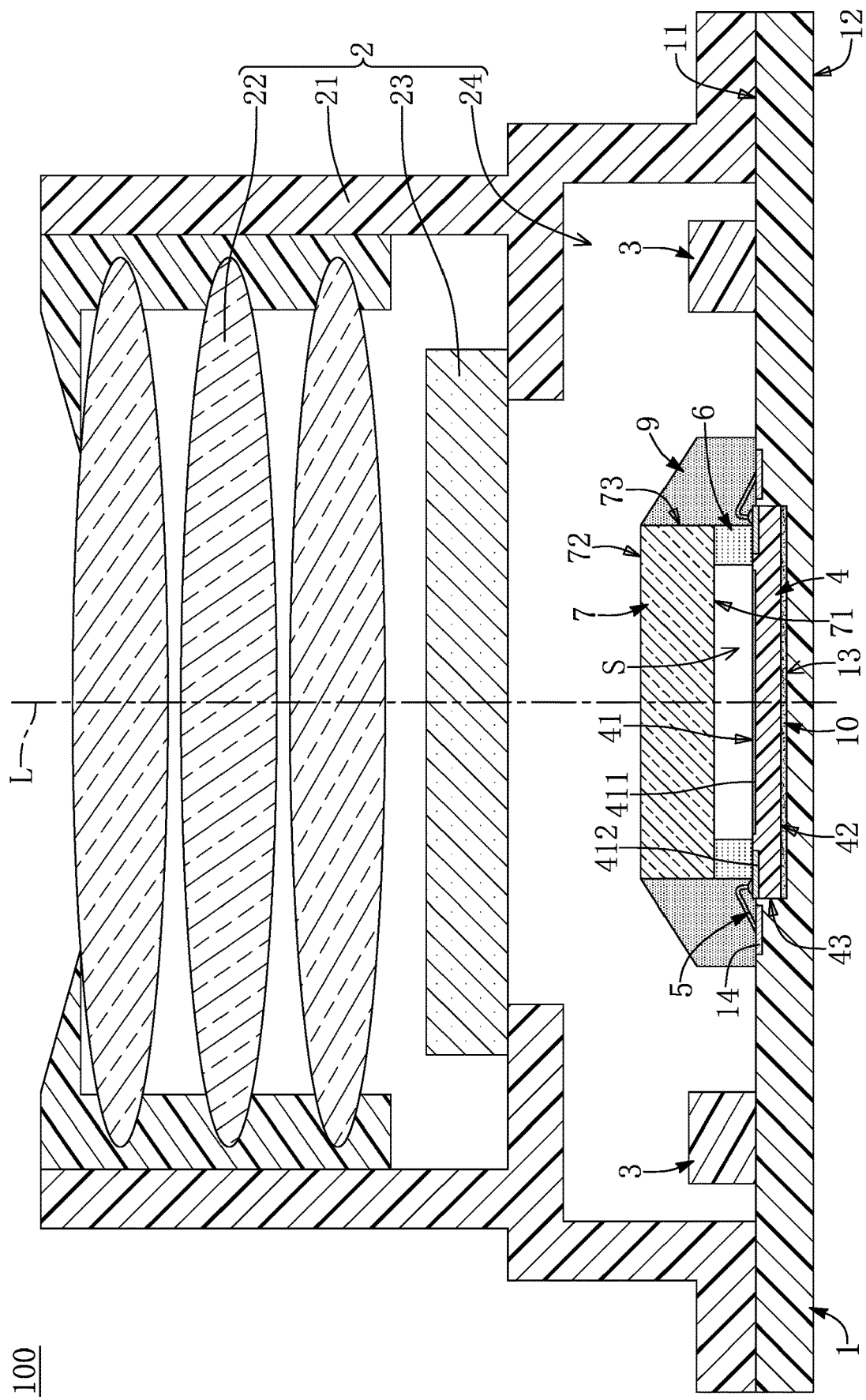
FIG. 10 is a cross-sectional view of the sensor lens assembly according to a third embodiment of the present disclosure.

Referring to FIG. 10, a third embodiment of the present disclosure is provided, which is similar to the first and second embodiments of the present disclosure. For the sake of brevity, descriptions of the same components in the first to third embodiments of the present disclosure (e.g., the circuit board 1, the optical module 2, and the passive electronic component 3) will be omitted herein, and the following description discloses the different features among the first to third embodiments.

In the present embodiment, the sensor lens assembly 100 does not have the shielding layer 8 described in the first embodiment, the supporting adhesive layer 6 can be light-permeable or opaque and is only disposed on the top surface of the sensor chip 4, and the wires 5, the soldering pads 14, and the connection pads 412 are arranged outside of the supporting adhesive layer 6, thereby preventing the sensing region 411 of the sensor chip 4 from occurring the flare phenomenon due to the above components.

Moreover, the sensor lens assembly 100 in the present embodiment further includes a sealing compound 9. The sealing compound 9 surrounds the supporting adhesive layer 6 and the light-permeable sheet 7, and the connection pads 412, the wires 5, and the soldering pads 14 are embedded in the sealing compound 9, thereby avoiding being destroyed by an external force.

Beneficial Effects of the Embodiments

In conclusion, through cooperation of the above components, the sensor lens assembly provided by the present disclosure does not need to go through any reflow process through the non-reflow configuration thereof, such as to allow that the component relationships arranged in the distribution space (e.g., connection between any two of the sensor chip, the wires, the supporting adhesive layer, and the light-permeable sheet) just need to satisfy a lower level of high-temperature resistance requirement. Accordingly, a material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

Moreover, the sensor lens assembly in the present disclosure is provided with the sensor chip that is disposed in the chip-receiving slot by a specific condition (e.g., the step difference is less than or equal to 10 µm), so that formation of each of the wires is no longer limited by height of the sensor chip, and the distance between any one of the soldering pads and the corresponding connection pad can be reduced. Accordingly, the size of the sensor lens assembly can be further reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor lens assembly having a non-reflow configuration, comprising:
    a circuit board having a first surface and a second surface that is opposite to the first surface, wherein the circuit board has a chip-receiving slot recessed in the first surface, and the circuit board includes a plurality of soldering pads that are arranged on the first surface and that are adjacent to the chip-receiving slot;
    an optical module including:
        a frame fixed on the first surface of the circuit board;
        at least one lens assembled into the frame, wherein a central axis of the at least one lens passes through the chip-receiving slot; and
        a filtering sheet assembled into the frame and positioned along the central axis, wherein the frame, the filtering sheet, and the first surface jointly define a distribution space, and the chip-receiving slot and the soldering pads are arranged in the distribution space;
    a sensor chip including a sensing region arranged on a top surface thereof and a plurality of connection pads that are arranged on the top surface and outside of the sensing region, wherein the sensor chip is disposed in the chip-receiving slot, and the top surface of the sensor chip and the first surface of the circuit board have a step difference therebetween that is less than or equal to 10 µm;

a plurality of wires, wherein the soldering pads are respectively and electrically coupled to the connection pads through the wires;

a supporting adhesive layer being in a ringed shape and being arranged outside of the sensing region;

a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space, and wherein a projection region defined by orthogonally projecting a surrounding lateral surface of the light-permeable sheet onto the first surface is defined as an outer boundary; and a shielding layer being in a ringed shape and formed on the light-permeable sheet, wherein a projection space defined by orthogonally projecting the shielding layer toward the circuit board is located outside of the sensing region and covers the soldering pads of the circuit board and the wires;

wherein the soldering pads of the circuit board and the wires are entirely embedded in the supporting adhesive layer that is entirely arranged in the projection space and that does not protrude from the outer boundary.

2. The sensor lens assembly according to claim 1, wherein the connection pads are arranged on the top surface in a ring-shaped arrangement, inner edges of the connection pads jointly define an inner boundary, and wherein the supporting adhesive layer is disposed on at least part of a region between the inner boundary and the outer boundary.

3. The sensor lens assembly according to claim 2, wherein the supporting adhesive layer is further disposed on an external portion of the top surface of the sensor chip and surrounds the sensing region.

4. The sensor lens assembly according to claim 3, wherein the supporting adhesive layer is light-permeable.

5. The sensor lens assembly according to claim 1, wherein the top surface of the sensor chip is coplanar with the first surface of the circuit board.

6. The sensor lens assembly according to claim 1, wherein, when light passes through the at least one lens, the filtering sheet is configured to allow the light of a wavelength band corresponding to the sensing region to pass therethrough.

7. The sensor lens assembly according to claim 1, further comprising at least one passive electronic component arranged in the distribution space and assembled onto the first surface of the circuit board.

8. A sensor lens assembly having a non-reflow configuration, comprising:

a circuit board having a first surface and a second surface that is opposite to the first surface, wherein the circuit board has a chip-receiving slot recessed in the first surface, and the circuit board includes a plurality of soldering pads that are arranged on the first surface and that are adjacent to the chip-receiving slot;

an optical module including:
a frame fixed on the first surface of the circuit board;
at least one lens assembled into the frame, wherein a central axis of the at least one lens passes through the chip-receiving slot; and
a filtering sheet assembled into the frame and positioned along the central axis, wherein the frame, the filtering sheet, and the first surface jointly define a distribution space, and the chip-receiving slot and the soldering pads are arranged in the distribution space;

a sensor chip including a sensing region arranged on a top surface thereof and a plurality of connection pads that are arranged on the top surface and outside of the sensing region, wherein the sensor chip is disposed in the chip-receiving slot, and the top surface of the sensor chip and the first surface of the circuit board have a step difference therebetween that is less than or equal to 10 μm;

a plurality of wires, wherein the soldering pads are respectively and electrically coupled to the connection pads through the wires;

a supporting adhesive layer being in a ringed shape and being arranged outside of the sensing region;

a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space; and a shielding layer being in a ringed shape and formed on the light-permeable sheet, wherein a projection space defined by orthogonally projecting the shielding layer toward the circuit board is located outside of the sensing region and covers the soldering pads of the circuit board and the wires;

wherein the soldering pads of the circuit board and the wires are entirely embedded in the supporting adhesive layer that is entirely arranged in the projection space.

9. A sensor lens assembly having a non-reflow configuration, comprising:

a circuit board having a first surface and a second surface that is opposite to the first surface, wherein the circuit board has a chip-receiving slot recessed in the first surface, and the circuit board includes a plurality of soldering pads that are arranged on the first surface and that are adjacent to the chip-receiving slot;

an optical module including:
a frame fixed on the first surface of the circuit board;
at least one lens assembled into the frame, wherein a central axis of the at least one lens passes through the chip-receiving slot; and
a filtering sheet assembled into the frame and positioned along the central axis, wherein the frame, the filtering sheet, and the first surface jointly define a distribution space, and the chip-receiving slot and the soldering pads are arranged in the distribution space;

a sensor chip including a sensing region arranged on a top surface thereof and a plurality of connection pads that are arranged on the top surface and outside of the sensing region, wherein the sensor chip is disposed in the chip-receiving slot, and the top surface of the sensor chip and the first surface of the circuit board have a step difference therebetween that is less than or equal to 10 μm;

a plurality of wires, wherein the soldering pads are respectively and electrically coupled to the connection pads through the wires;

a supporting adhesive layer being in a ringed shape and being arranged outside of the sensing region;

a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space, and wherein a projection region defined by orthogonally projecting a surrounding lateral surface of the light-permeable sheet onto the first surface is defined as an outer boundary;

wherein the soldering pads of the circuit board and the wires are entirely embedded in the supporting adhesive layer that that does not protrude from the outer boundary.

* * * * *